United States Patent
Fung et al.

(10) Patent No.: US 8,618,866 B2
(45) Date of Patent: Dec. 31, 2013

(54) APPARATUS AND METHODS FOR BALANCING SUPPLY VOLTAGES

(75) Inventors: Richard W. Fung, Markham (CA); Ramesh Senthinathan, Richmond Hill (CA)

(73) Assignee: ATI Technologies ULC, Markham, Ontario (CA)

( * ) Notice: Subject to any disclaimer, the term of this patent is extended or adjusted under 35 U.S.C. 154(b) by 2327 days.

(21) Appl. No.: 10/908,163

(22) Filed: Apr. 29, 2005

(65) Prior Publication Data

US 2006/0244512 A1  Nov. 2, 2006

(51) Int. Cl.
*G11C 5/14* (2006.01)
(52) U.S. Cl.
USPC .......................................................... 327/530
(58) Field of Classification Search
USPC ................................................. 327/530, 538
See application file for complete search history.

(56) References Cited

U.S. PATENT DOCUMENTS

| | | | | |
|---|---|---|---|---|
| 5,675,269 A * | 10/1997 | Nakauchi | ......................... | 327/77 |
| 6,040,737 A * | 3/2000 | Ranjan et al. | ................. | 327/543 |
| 6,445,245 B1 * | 9/2002 | Schultz et al. | ................. | 327/541 |
| 6,762,620 B2 * | 7/2004 | Jang et al. | ........................ | 326/30 |
| 2003/0038666 A1 * | 2/2003 | Wada | .............................. | 327/530 |
| 2003/0193363 A1 * | 10/2003 | Egan | ............................... | 327/530 |
| 2005/0083110 A1 * | 4/2005 | Latham et al. | ................. | 327/538 |

* cited by examiner

*Primary Examiner* — Quan Tra
(74) *Attorney, Agent, or Firm* — Faegre Baker Daniels LLP (57) ABSTRACT

Methods and apparatus for matching voltages between two or more circuits within an integrated circuit is disclosed. The apparatus includes a comparator circuit, comparing supply voltages to first and second circuits. The comparator outputs a variable error voltage based on the comparison, the error voltage related to the difference in voltages. The error voltage is supplied to a variable current control circuit that variably sinks one of the supply voltages to a common potential in order to increase the IR drop in the circuit supplying voltage to one of the first and second circuits, thereby affording voltage adjustment in order to match the first and second circuits. A corresponding method is also disclosed.

8 Claims, 5 Drawing Sheets

APPARATUS AND METHODS FOR BALANCING SUPPLY VOLTAGES

The present disclosure relates to apparatus and methods for balancing supply voltages and, more particularly, for balancing supply voltages delivered to a circuit within an integrated circuit, such as a digital-to-analog converter, as an example.

BACKGROUND

In integrated circuits, such as Application Specific Integrated Circuits (ASICs) (e.g., graphics processing chips), various circuits or sub-circuits within the integrated circuit are supplied with supply voltages driving or providing power to these circuits. In particular circuits, such as a digital-to-analog converter (DAC) array or multiple bank it is desirable to provide the same power supply voltage to each DAC channel (i.e., each individual digital-to-analog converter circuit in the DAC array). More specifically, in graphics processing integrated circuits, multiple DAC channels are used when driving a monitor or similar display medium. When power supplies to each of the DAC channels are matched, the most accurate color reproduction and acuity is achieved when displaying images on the display medium. Conversely, when the power supply voltages are not closely matched between each of the individual DAC channels, color reproduction and acuity become degraded.

Figure 1:
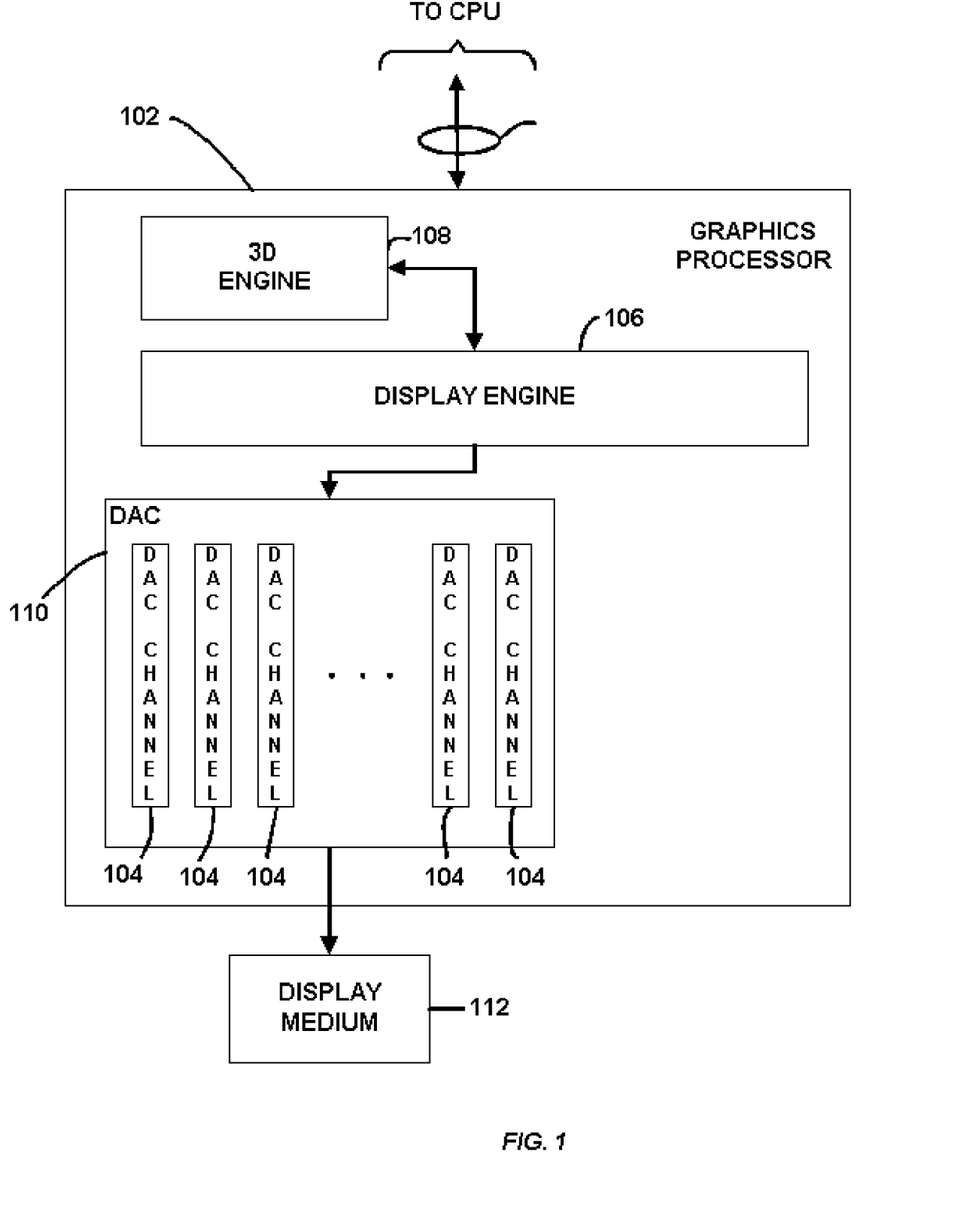
FIG. 1 illustrates an exemplary block diagram an integrated circuit used for graphics processing.

FIG. 1 illustrates an example of a graphics processing integrated circuit 102 including multiple digital-to-analog channels 104 being driven by a display engine 106. The display engine 106, as an example, may receive render image data from a 3-D engine 108 based on data received from an external processor such as a central processing unit [CPU] (not shown). The rendered images are sent by the display engine 106 to a multiple bank of digital-to-analog converters 110, as an example, wherein each DAC channel 104 converts digital data to analog voltages or currents for driving a display medium 112. For example, each of the DAC channels 104 may convert data concerning different colors in a pixel (i.e., RGB). In order to ensure that the colors are most accurately reproduced and acuity is optimal, supply voltages to each of the respective DAC channels 104 should ideally be matched or equal.

Figure 2:
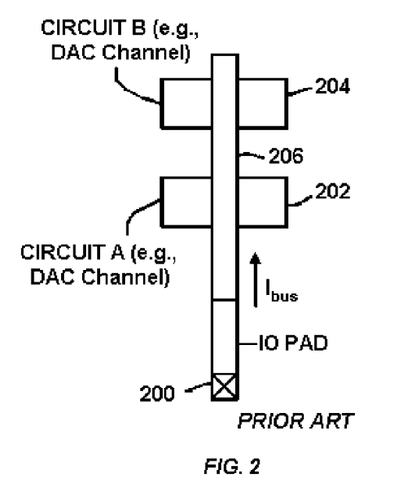
FIG. 2 illustrates a conventional physical layout for supplying power to two or more circuits.
Figure 3:
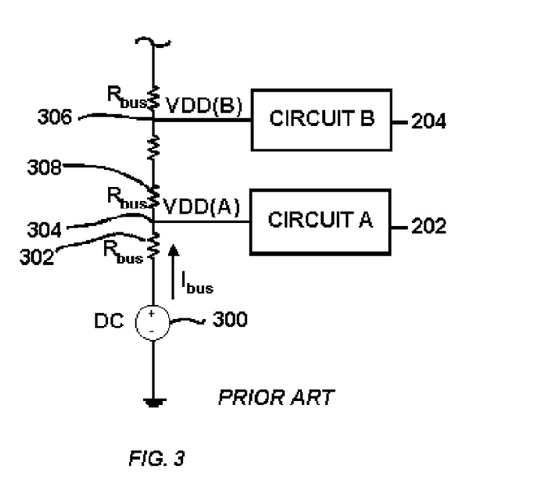
FIG. 3 illustrates a circuit diagram equivalent of the layout of FIG. 2.

Conventional construction of voltage supply traces delivering supply voltages within integrated circuits, however, inherently introduce voltage losses due to IR drop that, in turn, give rise to voltage mismatch between different DAC channels. As an example, FIG. 2 illustrates a conventional voltage supply where a voltage is delivered to an input/output (I/O) pad 200 that is, in turn, delivered from the I/O pad 200 to respective circuits "A" 202 and "B" 204 by a metal trace 206, for example. FIG. 2, in particular, illustrates the physical layout of the voltage supply trace 206 as it is connected to different circuits, such as circuits 202 and 204. FIG. 3 illustrates an equivalent circuit diagram of the physical configuration of FIG. 2. As illustrated, the voltage supply 300, which is shown as a DC voltage supply, delivers power over the trace or bus 206 to the circuits 202 and 204. As current flows through the bus 206, the inherent resistance or impedance of the metal trace, which typically constitutes the bus 206, leads to voltage drops as governed by Ohm's Law. (i.e., V=IR).

Current in the bus flows through a first part of the bus 206 represented by resistor 302 in FIG. 3. This resistance 302 is present in the port of the bus 206 between the I/O pad 200 and a connection node 304 where the bus 206 connects to circuit 202. A voltage supply VDD(A) is present at this node 304, which is the input to circuit 202. As shown in FIG. 3, a second node 306 is illustrated where circuit 204 connects to the bus 206. Additional resistance occurs between nodes 304 and 306 in the metal trace of the bus 206. This resistance is illustrated in FIG. 3 by resistance 308. As current flow through the resistance 308 and as a result an additional voltage drop occurs between nodes 304 and 306, voltage VDD(B) which may be different from VDD(A), is delivered to circuit B 204. In circuits having lower current consumption, the voltage drops due to the bus resistances in 302 and 308 are, for the most part, negligible and do not result in significant voltage mismatch between VDD(A) and VDD(B). However, if circuit 204, draws a high current, the voltage drop across resistor 308, for example, becomes significant and results in a detrimental mismatch between VDD(A) and VDD(B).

Figure 4:
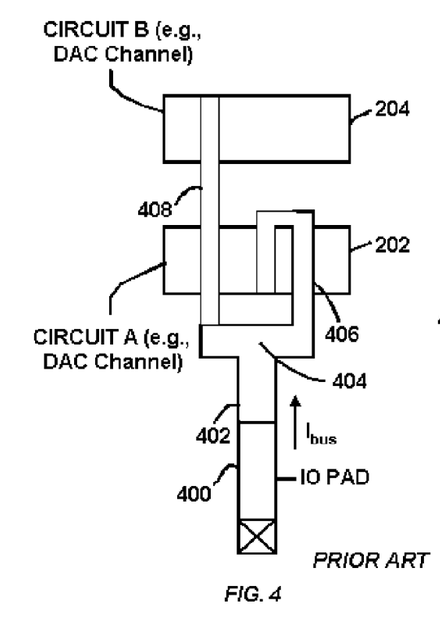
FIG. 4 illustrates another conventional physical power supply configuration for supplying power to two or more circuits.
Figure 5:
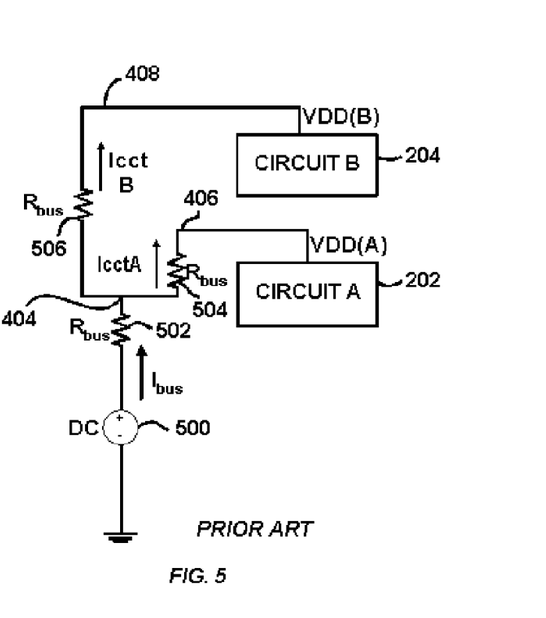
FIG. 5 illustrates a circuit diagram equivalent of the layout of FIG. 4.

In order to cure the problems inherent with a linear metal trace as illustrated in FIGS. 2 and 3, it is known in the art to mitigate the effects of the layout of FIG. 2 by matching the lengths of the metal traces to each of the circuits A and B (202, 204) in order to minimize voltage mismatch. An example of such a configuration is illustrated in FIGS. 4 and 5. FIG. 4, in particular, illustrates the physical layout where voltage is supplied to an I/O pad 400 supplying the circuits A and B (202, 204). The power supply bus 402, which may consist of a metal trace, as an example, is split at a tee region or star-connection 404, with two traces 406 and 408 emanating from the tee region 404 to supply voltage to circuits 202 and 204, respectively. As shown, the trace 406 includes a structural configuration (e.g., a serpentine or u-shaped trace) whereby the length of trace 406 is matched to the length of trace 408.

FIG. 5 illustrates an equivalent circuit diagram of the physical layout of FIG. 4. As shown, a voltage supply 500 supplies voltage to the bus 402, where the common portion prior to the star-connection has an inherent resistance as illustrated by resistor 502. The tee portion 404 of the star connection then splits the bus to supply respective voltages to circuits 202 and 204 via the legs 406 and 408. Each of these traces 406 and 408 have the same length or, more specifically, the same current and resistance product such that the inherent respective voltage (IR) drops through 504 and 506 are equal. Accordingly, when the currents $I_{CCTA}$ and $I_{CCTB}$ are equal, the voltages VDD(A) and VDD(B) are matched. Although the circuits of FIGS. 4 and 5 serve to reduce the mismatch of voltages predominant in the circuits FIGS. 2 and 3, voltage mismatch may still occur, especially when one of the circuits has a higher current draw than the other circuit, resulting in voltage mismatch. This mismatch may further be exacerbated by the problems inherent in manufacturing, such as low tolerances where matching the lengths and current densities of legs 406 and 408 do not yield a perfect matching of resistances 504 and 506. Thus, given uncertainties in processing tolerances of the integrated circuit, there is a limit to which matching of the voltage drop due to IR can be realized. Further, different criterion may further degrade or worsen voltage matching if each of the circuits A and B must have individual power bus connections, which may result in additional compounding voltage mismatch due to bond wire impedances within and board trace impedances to the integrated circuit package.

DETAILED DESCRIPTION OF THE PRESENT EMBODIMENTS

The present application discloses a voltage matching circuit for matching voltages in first and second circuits and, more particularly, first and second circuits within an integrated circuit, such as an ASIC. The circuit includes a comparator circuit having a first input coupled to a first supply voltage of the first circuit and a second input coupled to a second supply voltage of the second circuit. The comparator circuit is configured to output a variable error voltage that is varied based on a comparison of voltages input to a first and second inputs and is related to the difference in voltages between the first and second. The voltage matching circuit also includes at least one variable current control circuit electrically connected between one of the first and second supply voltages and ground and responsive to the variable error voltage to vary a current between one of the first and second supply voltages to a common potential such as ground in order to substantially balance the first and second supply voltages.

The present application also discloses a method for balancing supply voltages of first and second circuits within an integrated circuit. The method includes deriving a first supply voltage from the first circuit and a second supply voltage from the second circuit. The first supply voltage is then compared to the second supply voltage and an error voltage is derived based on the comparison of the voltages. The error voltage is variable according to a predetermined relationship based on a difference between the first and second supply voltages. Finally, the method includes variably sinking current from one of the first and second supply voltages to a common potential such as ground based on the error voltage to achieve substantially equal levels of the first and second supply voltages.

By including a comparator circuit driving a current control circuit, a feedback loop is formed to more accurately and actively balance or match voltages supplied to two different circuits. The use of a variable current circuit, in particular, which sinks current in order to increase the amount of current delivered to a particular circuit section, affords control of the current and thus control of the voltage drop across the supply voltage resistance (e.g., increases the voltage drop by increasing the current in the resistance) in order to ensure voltage matching. Moreover, the use of feedback in a current control circuit allows compensation for AC voltage transient variations that may occur on feeds to particular circuits within an integrated circuit.

Figure 6:
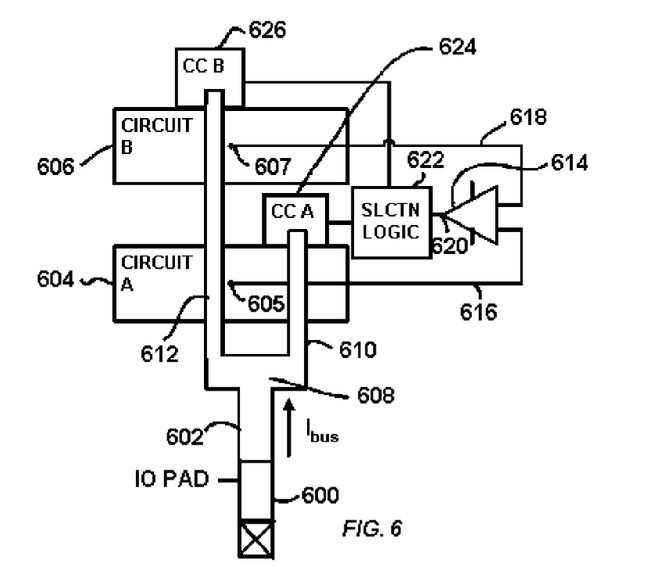
FIG. 6 illustrates an example of a physical circuit layout for supplying power to two or more circuits according to the present disclosure.
Figure 7:
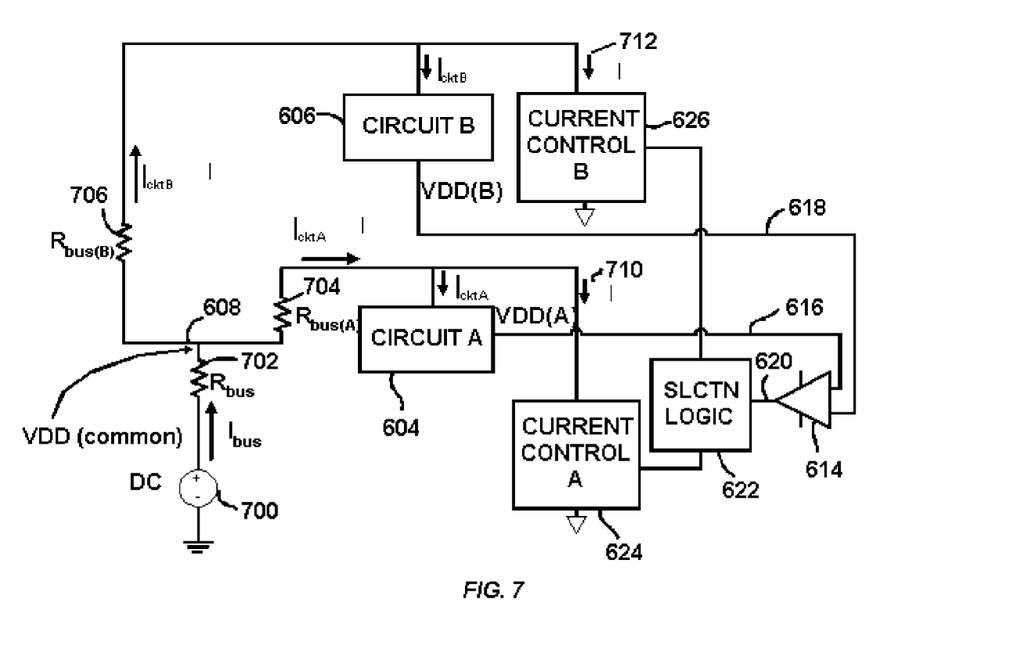
FIG. 7 illustrates an example of a circuit diagram equivalent of the circuit of FIG. 6.

FIGS. 6 and 7 illustrate an example of a circuit layout that may be used to balance supply voltages of two or more circuits. In particular, FIG. 6 illustrates a physical layout of a power supply circuit utilizing feedback to match supply voltages to two circuits. As shown, an I/O pad 600 is provided that is configured to receive a supply voltage. The IO pad 600 connects to a power supply bus 602 that supplies voltage to circuits "A" 604 and "B" 606. It is noted that the bus 602 may be defined by a conductive element including any number of desired metal traces as known in the art.

The particular physical layout of the bus 602 includes a star connection or "tee" junction 608, from which emanate two portions or branches 610 and 612 that supply voltages to circuits 604 and 606, respectively. It is noted that this physical configuration is merely exemplary and that any type of bus or trace configuration may be utilized. Nonetheless, the use of a star connection 608, similar to the prior art circuits previously described in connection with FIGS. 4 and 5, helps to mitigate mismatch of the current densities of traces (e.g., 610 and 612) to particular circuits (e.g., 604, 606).

The circuit of FIG. 6 also includes a comparator circuit 614 that has two input lines 616 and 618, respectively connected to respective points 605 and 607 in circuits 604 and 606. In one example, the input lines 616 and 618 are connected to a physical power grid center point of the circuits 604 and 606, respectively, in order to ensure the voltages being delivered to the comparator 614 accurately reflect the supply voltages within the circuits 604 and 606. The comparator 614 is configured to compare the voltages of the circuits 604 and 606 via the input sensing lines 616 and 618 in order to determine a differential (i.e., a mismatch) between the voltages of the circuits 604 and 606. An output 620 of the comparator circuit 614 is an error voltage that may be delivered to a selection logic 622, which, in turn, decides which of two current control circuits 624 and 626 will receive the error voltage signal of output 620. It is noted that the selection logic 622 is optional, and alternatively, the voltage error signal on the output 620 may simply be delivered to one of the current control circuits 624 or 626. It is noted that the control logic 622 may include any known programmable logic or state machine suitable for selecting between which of the current control circuits 624 or 626 will receive the voltage error signal. In particular, regardless of the type of logic or state machine utilized for the control logic 622, the logic is configured to select delivery of the voltage error signal to the particular control circuit (624 or 626) associated with the circuit (604 or 606) that has the greater voltage value. This is because the current control circuits operate to reduce the voltage supply by creating a greater IR drop in order to reduce the supply voltage. Not withstanding, it may be contemplated by those skilled in the art that a different logic arrangement to be utilized where, rather than using current control circuits, some other type of circuit may be utilized where voltage may be added to boost a supply voltage delivered to a particular circuit (604 and 606, for example).

FIG. 7 illustrates a circuit diagram of the physical circuit layout of FIG. 6. As shown, a voltage supply 700, which is the voltage delivered to the I/O pad 600 of FIG. 6, is connected via the bus trace to the tee or star connection 608. A resistance (or impedance) 702 is illustrated to represent the resistance of the portion of the bus from the I/O pad to the connection 608. The voltage present at the tee 608 is labeled VDD, which is a common voltage present prior to splitting the traces to the respective circuits 604 and 606. Further, the circuit diagram of FIG. 7 illustrates that each of the traces 610 and 612 have an inherent resistance, represented by resistors 704 and 706. The current control circuits 624 and 626 are shown coupled electrically in parallel with circuits 604 and 606, respectively.

In operation, the circuit of FIG. 7 senses the voltage supplied to at least one of circuits 604 and 606 with the comparator circuit 614 and sensing lines 616 and 618. As an example, when the supply voltage to circuit 604, which is labeled VDD(A) is greater than the supply voltage to circuit 606 (i.e., VDD(B)), a variable voltage error signal 620 is produced at output of comparator circuit 614 due to the sensed difference between the supply voltages. The voltage error signal 620 is then delivered via the selection logic 622 to current control circuit 624. The voltage error signal (Verror) 620 from output of the comparator circuit 614 is, according to an example, proportional to the difference between the voltages VDD(A) and VDD(B) (and thus variable) and causes the current control circuit 624 to sink a variable current ΔI 710 from the voltage supply for circuit 604 to a common potential such as ground. Thus the current flowing from the VDD common voltage at the star connection 608 through $R_{bus}$ (A) is increased and equal to the current to circuit A (i.e., $I_{cktA}$) plus the current ΔI 710. This increase in the total current flowing through the resistance 704 of bus 610 increases the voltage drop across this resistance 704, thus lowering the voltage VDD(A) delivered to circuit 604. Accordingly, voltage VDD (A) reduces to match the voltage of VDD(B). For purposes of this example, the current control circuit 624 is only operable while current control circuit 626 does not operate. Thus, a differential current 712, although, illustrated, would not be present through current control circuit 626. Accordingly, the Ohm's law equations governing this example would be as follows:

$$VDD(A)=VDD(\text{common})-(I_{cktA}+\Delta I)R_{bus(A)}$$

$$VDD(B)=VDD(\text{common})-I_{cktB}R_{bus(B)}$$

Figure 8:
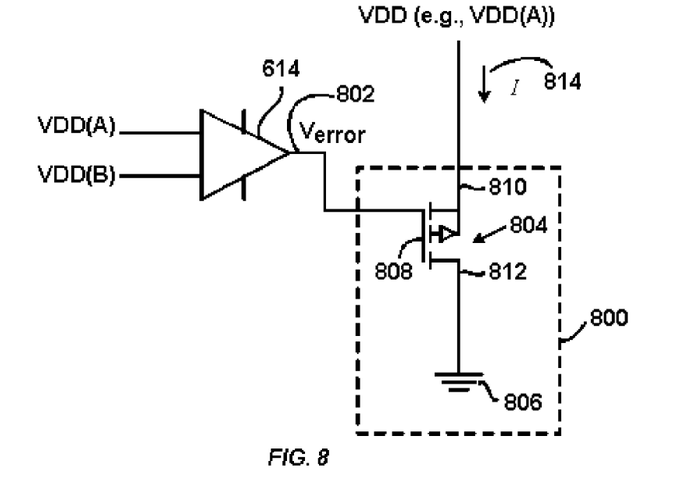
FIG. 8 illustrates an example of a current control circuit that may be used in the circuits of FIGS. 6, 7, and 9.

It is noted that in an example, the comparator circuit 614 is a high gain operational amplifier and that the overall accuracy of the voltage matching is dependent on the gain and offset performance of the operational amplifier. Moreover, the operational amplifier effects a negative feedback connection, where both inputs of the operational amplifier are forced to be the same. That is, the specific negative feedback circuit topology ensures that if one input of the operational amplifier changes in voltage, the other input will track it due to the feedback loop. Moreover, it is noted that the current control circuit 624, 626 or 800 may include any voltage controlled current source suitable for varying current flow based on a voltage input signal. Furthermore, the comparator circuit 614 may be configured to sweep the voltage error signal $V_{error}$ from zero volts up a supply voltage delivered to the comparator 614.

Alternatively, the current control circuit 626 may be used to reduce the voltage VDD(B) when VDD(B) is greater than VDD(A), or the selection logic 622 may be used to decide which of the supply voltages VDD(A) or VDD(B) is greater and correspondingly, direct the voltage error to the respective current control circuit (624 or 626) based on that determination.

FIG. 8 illustrates an exemplary construction of the current control circuits 624, 626. As shown, a current control circuit 800, enclosed by a dashed line box, receives a voltage error signal 802 from the comparator circuit 614. The current control circuit includes a transistor, such as a MOSFET 804 connected between one of the supply voltages VDD such as VDD(A), for example, and a common potential 806 (e.g., ground potential). The output level of the comparator circuit 614 is continuously variable based on the difference between the input voltages VDD(A) and VDD(B), thereby varying the level of the voltage error signal 802 in a negative feedback loop. This signal is then delivered to a gate 808 of the transistor 804, which may be driven in a saturation region, for example, and varies the current ΔI from the drain 810 to the source 812 of transistor 804. Accordingly, the current ΔI 814 can be varied or adjusted in order to, in turn, vary or adjust the supply voltage (either VDD(A) or VDD(B)). It is noted that the transistor 804 is sized to sink an expected ΔI 814 in order to ensure that the transistor 804 is capable of handling the expected amount of current. It is also noted that the circuit of FIG. 8 is merely exemplary and that any suitable circuit configuration utilizing active devices such as transistors or variable resistors may be contemplated and utilized by those skilled in the art.

In circuits, such as video DACs in a graphics processing chip, for example, small, alternating current (AC) variations may be incident in DC supply voltages. In particular, low frequency AC variations are particularly problematic if the bandwidth of the circuit (e.g., a video DAC channel) supplied by this voltage supply is much lower than the AC variations, because such AC variations would not be tracked, thereby causing AC voltage variations at the circuit output.

Figure 9:
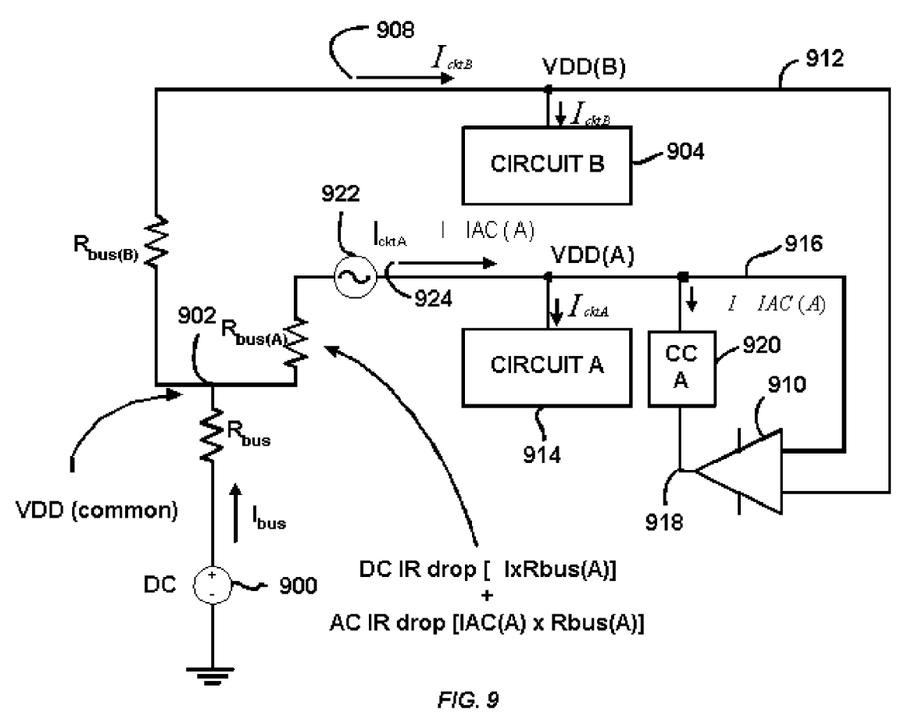
FIG. 9 illustrates another example of a circuit for matching voltages supplied to or more circuits where alternating current transients may be present.

FIG. 9 illustrates an example of a circuit arrangement according to the present disclosure that is operable to account for (i.e., canceling and/or reducing) small AC supply variations to compensate for the circuit's inability in tracking AC supply variations in order to ensure matching of the supply voltages in circuits A and B. In particular, FIG. 9 illustrates a DC voltage source 900 supplying a VDD common voltage at a star or tee junction 902 of the bus, similar to the circuit of FIG. 7. In the particular example of FIG. 9, an AC voltage variation is induced or imposed on the supply to circuit 914 as indicated symbolically by an AC source 922. Thus, the current supplied to circuit 914 includes the DC current $I_{cktA}$ actually drawn by circuit A, plus an AC component, $I_{AC(A)}$, as indicated by current 924. In this scenario, VDD(B) does not have AC voltage variations and serves as the reference voltage.

Similar to the circuit of FIG. 7, a comparator circuit 910 is included that is used to compare the voltage VDD(B) delivered to circuit 904 via a sense line 912 with a voltage VDD(A) delivered to a circuit 914 via a sense line 916. The comparator circuit 910 is configured such that as it compares the voltage lines of input sensing 916 to 912 (e.g., VDD(A) to VDD(B)), any AC voltage variations present on VDD(A) relative to VDD(B) are output from the comparator 910 in the $V_{error}$ signal 918 to the current control circuit 920. Thus, current flowing in the circuit 920 to ground includes not only the DC component ΔI, but also includes a modulated component $I_{AC(A)}$ to cancel the AC voltage variations induced in the supply to circuit A 914, for example. As illustrated, the current 924 includes the component $I_{cktA}$ drawn by circuit 914, the current sunk ΔI to balance DC voltages VDD(A) and VDD(B), as well as the AC current component $I_{AC(A)}$, thus ensuring that the voltages VDD(A) and VDD(B) are matched in the AC component as well as the DC component of the voltage. In this operational scheme, the IR drop through resistor $R_{bus(A)}$ has both a DC IR drop component, $\Delta V(DC) = \Delta I \times R_{bus(A)}$, and an AC IR drop component, $\Delta V(AC) = I_{AC(A)} \times R_{bus(A)}$. The AC IR drop component serves to cancel the AC supply voltage variation as shown as AC voltage source 922.

Figure 10:
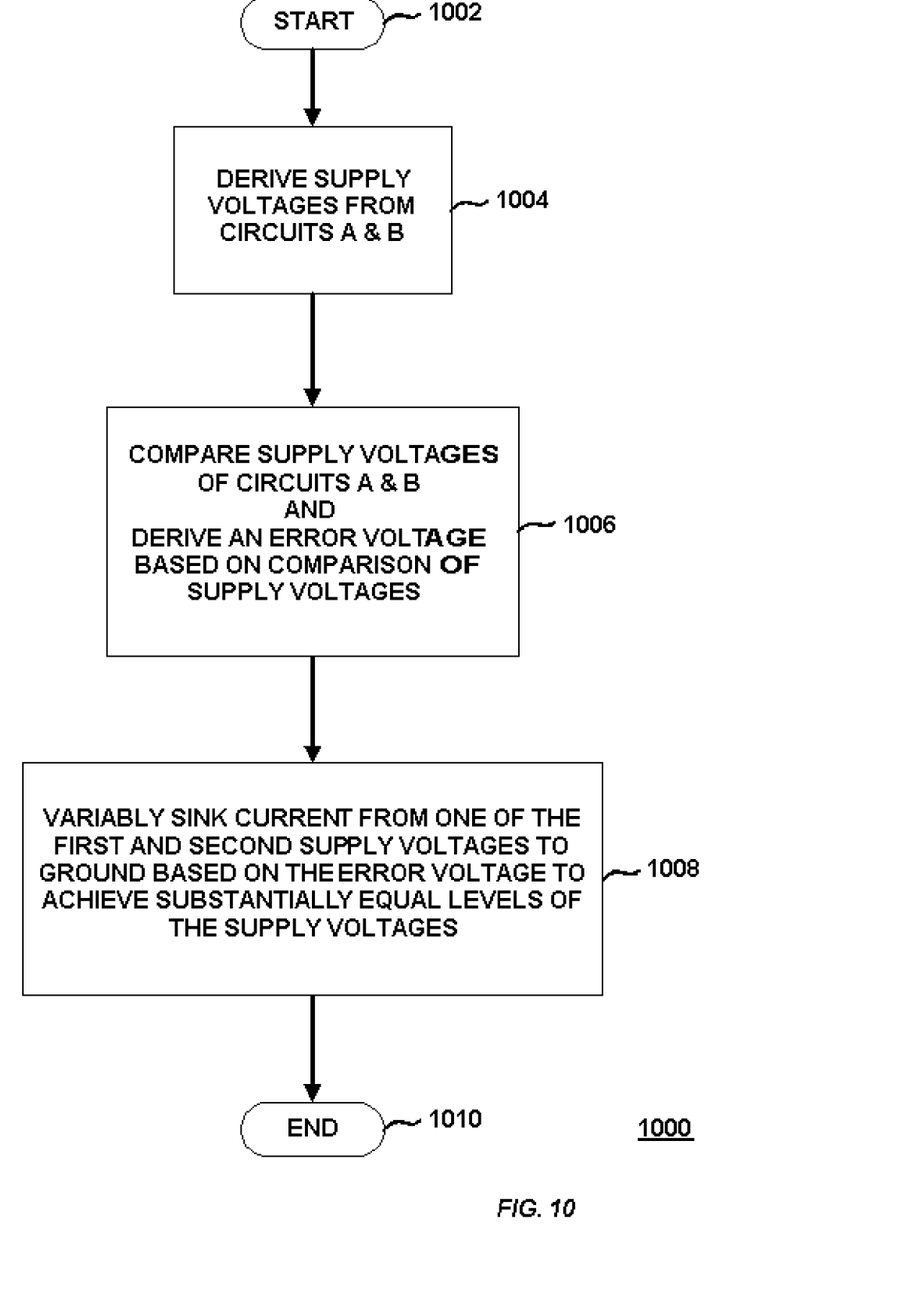
FIG. 10 illustrates a flow diagram of an exemplary method in accordance with the present disclosure.

FIG. 10 illustrates an example of a method that may be carried out with the circuits of FIGS. 6-9. As illustrated, the flow diagram 1000 initializes at a start block 1002 and proceeds to 1004 where supply voltages delivered to circuits A and B are derived. For example, this process is accomplished by the sense lines 616 and 618 in the circuit of FIG. 7. Next, flow proceeds to block 1006 where the supply voltages are compared and an error voltage is derived based on the comparison. This process is, for example, effected by the comparator circuit 614, which outputs an error voltage at output 620. Next, flow proceeds to block 1008 where the current control circuits variably sink current from one of the first and second supply voltages to ground based on the error voltage to achieve a substantially equal or matched level of the supply voltages. The process then ends at block 1010.

Based on the forgoing, the present application discloses apparatus and methods that achieve balancing or branching of supply voltages to two or more circuits, particularly circuits within an integrated circuit such as video DACs. By providing a feedback loop using sensing lines, a comparator, and a current control circuit, current is variably sunk to ground at a value that affords a voltage drop across the bus resistance of the bus feeding the circuit in order to increase the voltage drop from a common supply voltage in order to actively and, thus more accurately, balance the voltage supply to particular circuits. Moreover, because the present application discloses active balancing of voltages, process variations of the current densities in metal traces, in particular, supplying voltages to particular circuits within an integrated circuit are mitigated, ameliorating the need for exact impedance matching.

The above-detailed description of the examples has been presented for the purposes of illustration and description only and not by limitation. It is therefore contemplated that the present application cover any and all modification, variations, or equivalents that fall within the spirit and scope of the basic underlying principles disclosed above and the appended claims.

What is claimed is:

1. A voltage matching circuit for matching voltages in first and second circuits comprising:
   a comparator circuit having a first input coupled to a first supply voltage point of the first circuit and a second input coupled to a second supply voltage point of the second circuit, the comparator circuit configured to output a variable error voltage that is varied based on a comparison of voltages input to the first and second inputs and is related to the difference in voltage between the first and second supply voltage points, wherein the first and second supply voltage points are operative to receive first and second supply voltages, respectively;
   at least one variable current control circuit operatively coupled to at least one of the first and second supply voltage points, and responsive to the variable error voltage to vary a current between one of the first and second supply voltage points and a common potential point in order to match the first and second supply voltages; and
   a transistor coupled between one of the first and second supply voltage points and the common potential point and having an input to receive the voltage error signal and responsive to the voltage error signal to vary current passing through the transistor based on the values of the voltage error signal.

2. A voltage matching circuit for matching voltages in first and second circuits comprising:
   a comparator circuit having a first input coupled to a first supply voltage point of the first circuit and a second input coupled to a second supply voltage point of the second circuit, the comparator circuit configured to output a variable error voltage that is varied based on a comparison of voltages input to the first and second inputs and is related to the difference in voltage between the first and second supply voltage points, wherein the first and second supply voltage points are operative to receive first and second supply voltages, respectively;
   at least one variable current control circuit operatively coupled to at least one of the first and second supply voltage points, and responsive to the variable error voltage to vary a current between one of the first and second supply voltage points and a common potential point in order to match the first and second supply voltages;
   the at least one variable current control circuit comprises first and second variable current control circuits, and
   wherein the circuit further comprises selection logic coupled between the comparator circuit and the first and second variable current control circuits, the logic configured to determine which of the first and second supply voltages input at the first and second voltage points, respectively, is greater based on the error signal and selectively operate one of the first and second variable current control circuits based on the determination.

3. A voltage matching circuit for matching voltages in first and second circuits comprising:
   a comparator circuit having a first input coupled to a first supply voltage point of the first circuit and a second input coupled to a second supply voltage point of the second circuit, the comparator circuit configured to output a variable error voltage that is varied based on a comparison of voltages input to the first and second inputs and is related to the difference in voltage between the first and second supply voltage points, wherein the first and second supply voltage points are operative to receive first and second supply voltages, respectively;
   at least one variable current control circuit operatively coupled to at least one of the first and second supply voltage points, and responsive to the variable error voltage to vary a current between one of the first and second supply voltage points and a common potential point in order to match the first and second supply voltages; and
   wherein the first and second circuits are circuits within video digital-to-analog converters located in a graphics processing integrated circuit.

4. A voltage matching circuit for matching voltages in first and second circuits comprising:
   a comparator circuit having a first input coupled to a first supply voltage point of the first circuit and a second input coupled to a second supply voltage point of the second circuit, the comparator circuit configured to output a variable error voltage that is varied based on a comparison of voltages input to the first and second inputs and is related to the difference in voltage between the first and second supply voltage points, wherein the first and second supply voltage points are operative to receive first and second supply voltages, respectively;
   at least one variable current control circuit operatively coupled to at least one of the first and second supply voltage points, and responsive to the variable error voltage to vary a current between one of the first and second supply voltage points and a common potential point in order to match the first and second supply voltages; and
   wherein the first and second supply voltages are supplied from a common voltage source, and conductors delivering the first and second supply voltages to the first and second circuits from the common voltage source have substantially equal impedance.

5. An integrated circuit comprising:
   a first circuit coupled to a first supply voltage point, wherein the first supply voltage point is operative to receive a first supply voltage supplied from a common voltage source via a first portion of a power supply bus;
   a second circuit coupled to a second supply voltage point, wherein the second supply voltage point is operative to receive a second supply voltage supplied from the common voltage source via a second portion of the power supply bus; and
   a voltage matching circuit for matching the first and second supply voltages including:

a comparator circuit having a first input coupled to the first supply voltage point of the first circuit and a second input coupled to the second supply voltage point of the second circuit, the comparator circuit configured to output a variable error voltage that is varied based on a comparison of voltages input to the first and second inputs and is related to the difference in voltage between the first and second supply voltages according to a predetermined relationship;

at least one variable current control circuit electrically coupled between one of the first and second supply voltage points and a common potential point in parallel with at least one of the first and second circuits, and responsive to the variable error voltage to vary a sinking current between one of the first and second supply voltage points and the common potential point in order to match the first and second supply voltages; and a transistor coupled between one of the first and second supply voltage points and the common potential point and having an input to receive the voltage error signal and responsive to the voltage error to vary the sinking current passing through the transistor based on the values of the voltage error signal.

6. An integrated circuit comprising:

a first circuit coupled to a first supply voltage point, wherein the first supply voltage point is operative to receive a first supply voltage supplied from a common voltage source via a first portion of a power supply bus;

a second circuit coupled to a second supply voltage point, wherein the second supply voltage point is operative to receive a second supply voltage supplied from the common voltage source via a second portion of the power supply bus;

a voltage matching circuit for matching the first and second supply voltages including:

a comparator circuit having a first input coupled to the first supply voltage point of the first circuit and a second input coupled to the second supply voltage point of the second circuit, the comparator circuit configured to output a variable error voltage that is varied based on a comparison of voltages input to the first and second inputs and is related to the difference in voltage between the first and second supply voltages according to a predetermined relationship; and at least one variable current control circuit electrically coupled between one of the first and second supply voltage points and a common potential point in parallel with at least one of the first and second circuits, and responsive to the variable error voltage to vary a sinking current between one of the first and second supply voltage points and the common potential point in order to match the first and second supply voltages;

the at least one variable current control circuit comprises first and second variable current control circuits, and the integrated circuit further comprises selection logic coupled between the comparator circuit and the first and second variable current control circuits, the logic configured to determine which of the first and second supply voltages is greater based on the error signal and selectively operate one of the first and second variable current control circuits based on the determination.

7. An integrated circuit comprising:

a first circuit coupled to a first supply voltage point, wherein the first supply voltage point is operative to receive a first supply voltage supplied from a common voltage source via a first portion of a power supply bus;

a second circuit coupled to a second supply voltage point, wherein the second supply voltage point is operative to receive a second supply voltage supplied from the common voltage source via a second portion of the power supply bus;

a voltage matching circuit for matching the first and second supply voltages including:

a comparator circuit having a first input coupled to the first supply voltage point of the first circuit and a second input coupled to the second supply voltage point of the second circuit, the comparator circuit configured to output a variable error voltage that is varied based on a comparison of voltages input to the first and second inputs and is related to the difference in voltage between the first and second supply voltages according to a predetermined relationship;

at least one variable current control circuit electrically coupled between one of the first and second supply voltage points and a common potential point in parallel with at least one of the first and second circuits, and responsive to the variable error voltage to vary a sinking current between one of the first and second supply voltage points and the common potential point in order to match the first and second supply voltages; and wherein the integrated circuit is a graphics processing circuit and the first and second circuits are video digital-to-analog converters.

8. An integrated circuit comprising:

a first circuit coupled to a first supply voltage point, wherein the first supply voltage point is operative to receive a first supply voltage supplied from a common voltage source via a first portion of a power supply bus;

a second circuit coupled to a second supply voltage point, wherein the second supply voltage point is operative to receive a second supply voltage supplied from the common voltage source via a second portion of the power supply bus;

a voltage matching circuit for matching the first and second supply voltages including:

a comparator circuit having a first input coupled to the first supply voltage point of the first circuit and a second input coupled to the second supply voltage point of the second circuit, the comparator circuit configured to output a variable error voltage that is varied based on a comparison of voltages input to the first and second inputs and is related to the difference in voltage between the first and second supply voltages according to a predetermined relationship;

at least one variable current control circuit electrically coupled between one of the first and second supply voltage points and a common potential point in parallel with at least one of the first and second circuits, and responsive to the variable error voltage to vary a sinking current between one of the first and second supply voltage points and the common potential point in order to match the first and second supply voltages; and wherein the first and second portions of the power supply bus have substantially equal impedances.

* * * * *